United States Patent

[11] 3,617,774

[72] Inventor William G. Crouse
Raleigh, N.C.
[21] Appl. No. 16,504
[22] Filed Mar. 4, 1970
Division of Ser. No. 665,074, Sept. 1, 1967, Pat. No. 3, 539,826
[45] Patented Nov. 2, 1971
[73] Assignee International Business Machines Corporation
Armonk, N.Y.

[54] AUTOMATIC PHASE CONTROL CIRCUIT
3 Claims, 2 Drawing Figs.

[52] U.S. Cl. .......... 307/262, 323/109, 323/119, 328/155
[51] Int. Cl. .......... H03k 1/12
[50] Field of Search .......... 307/262, 229, 295; 328/55, 155; 323/109, 111, 119, 120, 121; 330/29

[56] References Cited
UNITED STATES PATENTS

| | | | |
|---|---|---|---|
| 3,316,427 | 4/1967 | Muskovac | 307/262 |
| 3,389,340 | 6/1968 | Forbes | 328/155 |
| 3,412,340 | 11/1968 | Chao | 330/29 |
| 3,418,497 | 12/1968 | Sauter et al. | 307/295 X |

*Primary Examiner*—Stanley T. Krawczewicz
*Attorneys*—John C. Black and Clark and Hanifin

ABSTRACT: An inverting amplifier includes a shunt feedback impedance element connected between its input and output terminals. The feedback current is divided between a series input resistance Rin and an impedance Rs shunting Rin. Either Rs or Rin is in the form of a variable impedance semiconductor device and a suitable source of control signals is applied to the semiconductor device to cause it to have a variable impedance. This variable impedance causes the output impedance Zo of the amplifier to vary as a function of the input control signals to the semiconductor device. The output impedance is resistive, capacitive, inductive, or the like, depending upon the nature of the feedback impedance of the amplifier; and the device is useful in varied applications such as automatic gain control, frequency and phase control, power regulation, delay equalizers, modulators and the like.

AUTOMATIC PHASE CONTROL CIRCUIT

This application is a division of copending application of William G. Crouse, the inventor herein, Ser. No. 665,074, filed Sept. 1, 1967, now U.S. Pat. No. 3,539,826.

BACKGROUND OF THE INVENTION

There has long been a need for electronically variable impedances. An automatic gain control circuit usually requires a resistance which can be varied electronically. An automatic frequency control circuit frequently requires a capacitance or an inductance, the value of which can be controlled by an electrical signal. There are devices which approach this problem. The nonlinear forward voltage-current characteristic of a semiconductor diode can have its dynamic resistance changed by varying the bias current through it. The junction capacitance of a semiconductor diode can be varied by changing the reverse voltage applied across the diode. The inductance of an iron core choke can be varied by applying a bias current to the coil. However, the limitation of all these devices is that the impedance of the device is nonlinear so that only very small signals can be applied to the impedances. Otherwise, the nonlinear characteristics will cause excessive distortion.

An article by Fred Susi in the July 19, 1963 issue of ELECTRONICS, describes at pages 60–62 the general concept of operating a transistor as a linearly variable resistance for signal attenuation. Briefly, the collector electrode of the transistor is isolated from direct-current voltage supplies. Signals which are to be attenuated are applied to a voltage divider including an input series resistance and the emitter-collector circuit of the transistor. Output signals are taken across the emitter-collector circuit. The input and output terminals are capacitively coupled to the collector electrode. However, this variable resistance is necessarily limited to an environment wherein the output voltage will be extremely small, since the collector current levels are very low and since the output voltage is the product of the collector current and the low emitter-to-collector impedance.

In a copending application of Joseph P. Pawletko, Ser. No. 469,499, filed July 6, 1965 and entitled "Character Recognition Apparatus," now U.S. Pat. No. 3,471,832, there is described a variation of the Susi structure whereby the transistor impedance varies linearly with input voltage to the base electrode of the transistor. Again, the output voltage from the attenuator is extremely low as in the case of the Susi structure.

The subject matter of the Susi article and of the Pawletko application is incorporated herein by reference as if set forth in their entirety.

It is an object of the present invention to provide an improved variable resistance device which can be utilized in an environment of large signals and which is variable at electronic speeds without introducing transients or distortion in its output.

It is another object of the present invention to provide a large signal electronically variable impedance which can be resistive, capacitive, inductive in nature, or actually equivalent to any two-terminal impedance network.

The improved circuit configuration is characterized by its ability to take any two-terminal element or network and multiply its current characteristic by an amount which can be controlled electronically.

SUMMARY OF THE INVENTION

The improved electronically variable impedance is characterized by an inverting amplifier having a shunt impedance element or network connected between its input and output terminals. Feedback current flowing in the feedback network is divided between a series input impedance of the amplifier and a shunt input impedance to the amplifier. Either the series or shunt input impedance has an electronically variable semiconductor device which forms a part of the input impedance. A source of control signals is applied to the semiconductor device to change its impedance in a desired manner. As this impedance is changed, the relative proportions of the feedback current in the series and shunt input impedance paths are varied accordingly. This in turn causes a change in the output impedance of the amplifier as seen from the circuits to which it is coupled.

This basic circuit configuration which provides an electronically variable impedance is utilized in an automatic phase control circuit.

BRIEF DESCRIPTION OF THE DRAWINGS

The foregoing and other objects, features and advantages of the invention will be apparent from the following more particular description of preferred embodiments of the invention, as illustrated in the accompanying drawings.

DESCRIPTION OF THE PREFERRED EMBODIMENT

Figure 1:
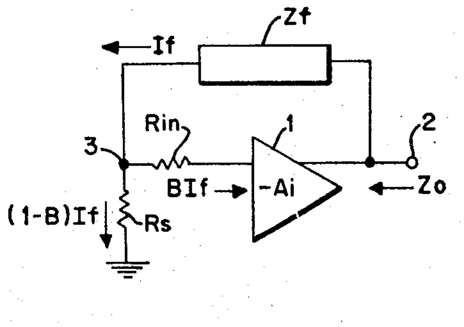
FIG. 1 illustrates the basic concept of the present invention.

FIG. 1 is shown merely for purposes of illustrating the general concept upon which an improved variable impedance circuit is based. Thus, FIG. 1 shows an amplifier 1 having an output terminal 2 which is out-of-phase with respect to an input terminal 3. A negative feedback impedance *Zf* is connected between the input and output terminals. The input terminal 3 is connected to the amplifier 1 by way of a series input resistance *Rin* and is connected to ground potential by way of a shunt input resistance *Rs*. A current, If, flows through the impedance *Zf* and is divided between the parallel paths comprising the impedances *Rin* and *Rs*. Thus a current BxIf flows into the amplifier and a current (1–B)If flows through Rs to ground.

It is common knowledge in feedback theory that if an impedance *Zf* (FIG. 1) is connected from the output 2 of a current amplifier 1 back to the input 3 of that amplifier, the output impedance Zo will decrease if the current amplifier has the output current out-of-phase from its input current. In fact, if all of the current which flows through this feedback impedance *Zf* flows into the input of the amplifier and the current gain of the amplifier is *Ai*, then the apparent output impedance *Zo* will be:

$$Zo=(Zf)/(Ai+1)$$

assuming the input impedance is zero.

If, at the input of the amplifier, a network is connected to shunt away some fraction of the feedback current so that the input current to the amplifier is B times the current through the impedance *Zf*, then the output impedance *Zo* becomes:

$$Zo=\frac{Zf}{(Ai\times B)+1}$$

Now, if the amplifier has a finite input resistance Rin and a resistance Rs shunts this input, then the value of B can be determined as follows:

$$B=Rs/(Rs+Rin).$$

The output impedance can now be calculated as follows:

$$Zo=\frac{Zf+\frac{Rs\ Rin}{Rs+Rin}}{\left(Ai\ \frac{Rs}{Rs+Rin}\right)+1}$$

(Rs and Rin being in series with *Zf*, must be added to *Zf*) and if:

$$Rs \ll Rin$$

$$A_i \cdot \frac{R_s}{Rs+Rin} \gg 1$$

$$2f \gg \frac{Rs \quad Rin}{Rs+Rin}$$

Then:

$$Zo = \frac{Zf \quad Rin}{Ai \quad Rs}$$

It can be seen that *Zo* is proportional to Rin and inversely proportional to *Rs*. If either or both Rin and *Rs* can be changed, this will change the output impedance *Zo*. Since the signal presented to *Rs* and Rin can be quite small compared to the signal at the output of the amplifier, this variable resistance Rin or *Rs* can be the nonlinear voltage-current characteristic of a semiconductor diode, or preferably, a saturated transistor with controlled base current as described in the above-identified issue of ELECTRONICS or the above-identified copending application.

*Zf* can be any type impedance and, therefore, an electronically variable resistance, capacitance, inductance, diode or any other two-terminal network can be provided. The limitations of the voltage and current which can be applied to the variable impedance *Zo* are determined by the limitations of the amplifier in a manner quite similar to the limitation of the normal signal to be developed on the output of the amplifier.

By proper choice of the variable impedance for Rin or *Rs*, and the means for varying the resistance, it is possible to change the output impedance *Zo* rapidly and without developing a transient on the output incident to a change in the control signal. This has been a major design problem in the past.

AN AUTOMATIC PHASE CONTROL FIG. 2

In a typical fixed phase control circuit, a center tapped secondary winding 100 of a transformer 101 has its remote terminals connected to a series resistor 102 and capacitor (not shown) network with the output signal being taken from the node between the resistor-capacitor and the center tap of the transformer. This circuit has phase shift characteristics which are a function of the resistor and capacitor, but have ideally no amplitude variations as a function of the frequency.

Figure 2:
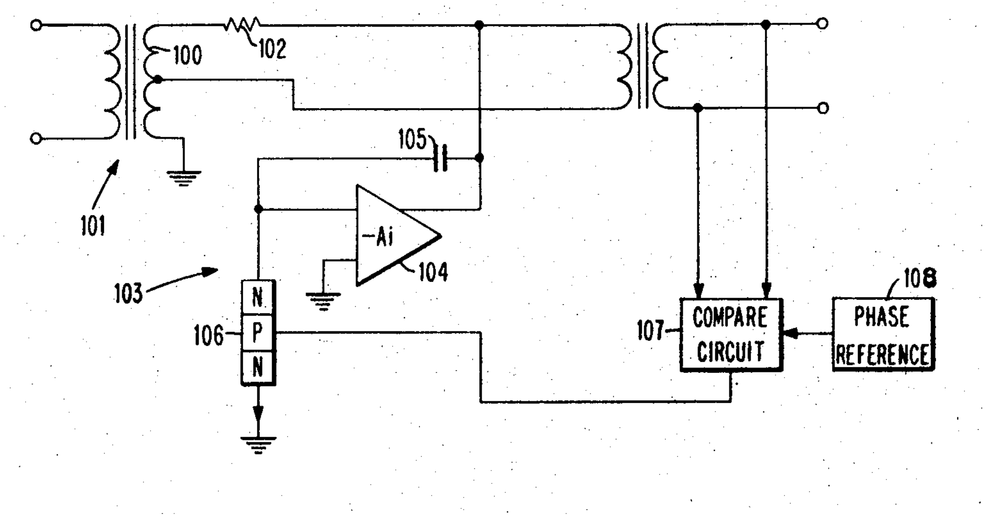
FIG. 2 illustrates the improved phase control circuit.

In the automatic phase control circuit of FIG. 2, the capacitor is replaced by the improved electronically variable capacitance device 103. The device 103 includes a differential amplifier 104, a shunt feedback capacitor 105 and a transistor 106. The output of this phase shift circuit is coupled to a compare circuit 107 for comparison with the output of a phase reference source 108 operating at the same frequency. The compare circuit 107 produces an output current which is a function of the relative phases between the received signal and the reference signal. This output current will increase if the phase shift is too great and decrease if the phase shift is not enough.

As this output current decreases, the resistance value of the transistor 106 will increase, thereby increasing the output capacitance of the shunt feedback amplifier causing an increase in phase shift to correct the original error.

An increase in the output current from the compare circuit 107 decreases the transistor resistance, thereby decreasing the output capacitance of the amplifier 104 to decrease the phase shift.

While the invention has been particularly shown and described with reference to preferred embodiments thereof, it will be understood by those skilled in the art that the foregoing and other changes in form and details may be made therein without departing from the spirit and scope of the invention.

I claim:

1. An automatic phase control circuit comprising
   a transformer including a primary winding adapted to receive signals and including a center-tapped secondary winding,
   a resistor and capacitive device coupled across the secondary winding,
   an inductive device connected between the center tap and the junction between the resistor and capacitive device,
   an amplifier having input and output terminals at which signal changes are substantially 180° out-of-phase with respect to each other, the terminals being connected across one of the devices to cause the device to act as a reactive shunt feedback,
   said amplifier including a series input impedance and an impedance shunting the series input impedance,
   one of the impedances being a semiconductor device having a resistance value which varies as a function of electrical signals applied thereto,
   a source of phase reference signals, MEANS PRODUCING CONTROL SIGNALS AS A FUNCTION OF THE DIFFERENCE IN PHASE BETWEEN THE RECEIVED SIGNALS AND THE REFERENCE SIGNALS, AND
   means applying the control signals to the semiconductor device to vary its resistance value, thereby varying the reactive output characteristic of the amplifier as a function of said semiconductor resistance value.

2. The combination of claim 1 wherein the semiconductor device is in the form of a common emitter transistor amplifier with its maximum emitter-to-collector potential maintained at a low level in the order of one hundred millivolts to produce a resistance which varies substantially linearly with changes in control signal level.

3. An automatic phase control circuit comprising
   a transformer including a primary winding adapted to receive signals and including a center-tapped secondary winding,
   a series-connected resistor and capacitive device coupled across the secondary winding,
   an inductive device connected between the center tap and the junction between the resistor and capacitive device,
   a differential amplifier having input and output terminals at which signal changes are substantially 180° out-of-phase with respect to each other, the terminals being connected across one of the devices to cause the device to act as a reactive shunt feedback,
   a common emitter transistor amplifier having its collector electrode coupled to the input terminal, including base and emitter electrodes, and operated with a maximum collector-to-emitter potential in the order of one hundred millivolts,
   a source of phase reference signals,
   means producing control signals as a function of the difference in phase between the received signals and the reference signals, and
   means applying the control signals to the base electrode to vary the reactive output characteristic of the differential amplifier as a function of the control signals.

* * * * *